United States Patent [19]
Ohsuga et al.

[11] Patent Number: 5,867,503
[45] Date of Patent: Feb. 2, 1999

[54] DIGITAL SOUND BROADCASTING RECEIVER AND AUTOMATIC PHASE CONTROLLING METHOD THEREFOR

[75] Inventors: Yoshiharu Ohsuga; Masahiro Tsujishita; Tadatoshi Ohkubo; Kenichi Taura, all of Tokyo, Japan

[73] Assignee: Mitsubishi Denki Kabushiki Kaisha, Tokyo, Japan

[21] Appl. No.: 785,506

[22] Filed: Jan. 17, 1997

[30] Foreign Application Priority Data

Jan. 30, 1996 [JP] Japan ................................. 8-014222
Apr. 3, 1996 [JP] Japan ................................. 8-081492
Nov. 7, 1996 [JP] Japan ................................. 8-295010

[51] Int. Cl.$^6$ .............................. G06F 11/00; H03C 5/00
[52] U.S. Cl. ........................................ 371/5.1; 375/269
[58] Field of Search ............................... 371/5.1, 5.2, 5.4,
371/5.5, 42, 47.1, 57.1, 61, 62, 46; 370/203,
204, 205, 330, 343, 478; 375/329, 334,
269, 293, 294, 362, 371

[56] References Cited

U.S. PATENT DOCUMENTS

| | | | |
|---|---|---|---|
| 4,423,390 | 12/1983 | Waters | 331/4 |
| 4,713,630 | 12/1987 | Matthews | 331/4 |
| 4,788,696 | 11/1988 | Sakane et al. | 371/5.4 |
| 5,228,025 | 7/1993 | Le Floch et al. | 370/206 |
| 5,309,443 | 5/1994 | Schorman | 371/5.5 |
| 5,455,536 | 10/1995 | Kono et al. | 371/5.4 |
| 5,490,176 | 2/1996 | Peltier | 375/325 |

FOREIGN PATENT DOCUMENTS

| | | |
|---|---|---|
| 0243589A2 | 4/1987 | European Pat. Off. . |
| 0309306A1 | 3/1989 | European Pat. Off. . |
| 2296396 | 6/1996 | United Kingdom . |

*Primary Examiner*—Trinh L. Tu

[57] ABSTRACT

A digital sound broadcasting receiver and method receives a radio wave from a digital sound broadcasting station, demodulates the radio wave into baseband signals at a tuner, subjects the signals to demodulation, performs error detection and error correction at signal processors to obtain digital data, and inputs the digital data into an audio circuit to obtain audio or data output. A CRC error rate detector 13 for a fast information channel (FIC) for APC pseudo lock releasing action on demodulating the signals is arranged to determine, based on the possibility of an error rate of an error-detecting code (CRC) of the FIC, whether an APC pseudo lock state occurs, and to control releasing action for the APC pseudo lock state.

14 Claims, 11 Drawing Sheets

CONVENTIONAL ART

DIGITAL SOUND BROADCASTING RECEIVER AND AUTOMATIC PHASE CONTROLLING METHOD THEREFOR

BACKGROUND OF THE INVENTION

Field of the Invention

The present invention relates to a digital sound broadcasting receiver which corresponds to an orthogonal frequency division multiplex modulation (hereinbelow, referred to as "OFDM") digital broadcasting system with respective carriers phase modulated wherein a synchronizing signal, which have a predetermined modulation, is transmitted in a frame.

DISCUSSION OF BACKGROUND

In FIG. 10, there is shown a block diagram of the structure of a conventional digital sound broadcasting receiver. Reference numeral 1 designates an antenna. Reference numeral 2 designates a frequency down-converter. Reference numeral 3 designates an A/D converter. Reference numeral 4 designates an IQ signal generator. Reference numeral 5 designates a fast Fourier transform (FFT) processor or a discrete Fourier transform (DFT) processor (hereinbelow, referred to as the "FFT processor"). Reference numeral 6 designates a deinterleave processor. Reference numeral 7 designates an error correcting processor which performs error correction in data by Viterbi decoding. Reference numeral 8 designates an audio decoder. Reference numeral 9 designates a digital audio output terminal. Reference numeral 10 designates a temperature compensated voltage controlled oscillator (hereinbelow, referred to as the "TCVCXO"). Reference numeral 11 designates a synchronization controller.

The OFDM digital broadcasting system with respective carriers phase modulated, as shown in FIG. 10, OFDM signals in an RF frequency band which have been inputted from the antenna 1 are down-converted into intermediate frequency signals at the frequency down-converter 2, are converted into digital signals at the A/D converter 3, and are divided into in-phase signal components (hereinbelow, referred to as the "I signal components") and quadrature signal components (hereinbelow, referred to as the "Q signal components") at the IQ signal generator 4. The I signal components and the Q signal components are converted into complex number data in a frequency region at the FFT processor 5, have the interleave treatment done at the transmitting end released at the deinterleave processor 6, are inputted into the audio decoder 8 as low bit rate coding data having errors corrected at the error correcting processor 7, are converted in a digital audio bit stream at the audio decoder 8, and are outputted from the digital audio output terminal 9.

On the other hand, the complex number data in the frequency region which are outputted from the FFT processor 5 are also inputted into the synchronization controller 11. The synchronization controller 11 controls oscillation frequency of the TCVCXO based on the inputted data. The TCVCXO 10 has output signals inputted into the frequency down-converter 2 to determine the center frequency of the intermediate frequency signals which are outputted from the frequency down-converter 2.

In FIG. 11, there is shown a block diagram of the structure of the synchronization controller 11. Reference numeral 100 designates a signal input terminal. Reference numeral 101 designates a control signal output terminal. Reference numeral 102 designates a phase error detector. Reference numeral 103 designates a first frequency error detector. Reference numeral 104 designates a second frequency error detector. Reference numeral 105 designates an adder.

In OFDM signals with respective carriers phase modulated, when the center frequency of the intermediate frequency signals outputted from the frequency down-converter 2 is ideal, the data outputted from the FFT processor 5 are centered on several specific phase angles. For example, in case of quarter phase-shift keying (QPSK), the data are centered on 4 points of $\pi/4$, $3\pi/4$, $-\pi/4$ and $-\pi/4$. However, in many cases, the phases of the data which are outputted from the FFT processor 5 are actually shifted from the points where the data are supposed to be focused.

The phase error detector 102 detects a phase error which is included in the data inputted from the FFT processor 5. The synchronization controller 11 finely adjusts the oscillation frequency of the TCVCXO 10 based on the output from the phase error detector 102 through the adder 105 to carry out automatic phase control (hereinbelow, referred to "APC") so that the data of respective frequencies outputted from the FFT processor 5 focus in the vicinity of the phase angles where the data are supposed to be focused.

However, in case of quarter phase-shift keying (QPSK), when a signal in the data inputted from the FFT processor 5 which is supposed to have a $\pi/4$ of phase is received as data in the vicinity of a 0 of phase, the signal is modified to be in the vicinity of a $-\pi/4$ of phase, and the APC process is locked at that location. This means that the data may be locked at a phase which shifts from the proper phase by $-\pi/2$. Shifting from the proper phase by $+\pi/2$, and shifting from the normal phase by $\pm\pi$ may be caused. Such an improper APC lock state is called an "APC pseudo lock".

As stated earlier, the respective data frames of the complex number data in the frequency band outputted from the FFT processor 5 include fixed patterns for synchronization. The second frequency error detector 104 compares the output data at those portions with a preheld pattern, and outputs a signal corresponding to the frequency error about the presence and the absence of the APC pseudo lock state. The synchronization controller 11 adjusts the oscillation frequency of the TCVCXO 10 based on the output from the second frequency error detector 104 through the adder 105, and carries out such control that lock is made at a proper phase angle by releasing the APC pseudo lock state and shifting to a new APC lock.

The first frequency error detector 103 compares the fixed pattern data for synchronization outputted from the FFT processor 5 with a preheld pattern, and detects a greater frequency error for each spacing between carrier frequencies. The synchronization controller 11 adjusts the oscillation frequency of the TCVCXO 10 based on the output from the first frequency error detector 103 through the adder 105. If the intermediate frequency signals include a greater frequency error than the spacing between the carrier frequencies, such a greater frequency error is detected and corrected for proper frequency tuning.

In FIGS. 12(a)–(c) there are shown schematic diagrams of the frequency control operation by the synchronization controller 11. In FIGS. 12(a)–(c), symbols "○" on frequency axes designate respective carrier frequencies of OFDM signals when tuning is accurately made. Subscripts "n−2" to "n+4" of the frequencies $f_{n-2}$ to $f_{n+4}$ represent carrier numbers. Symbols "x" on the frequency axes designate frequencies wherein respective carriers could be pulled in by the APC pseudo lock. In FIGS. 12(a)–(c), arrows designate the respective carriers of the received OFDM signals, which are denoted by the carrier numbers (n–4 to n+4).

An example of the frequency control operation by the synchronization controller 11 is carried out as follows:

In a case wherein the respective carrier frequencies of the OFDM signals deviate from proper values by more than two carrier frequency spacings, when the APC process is made based on the output from the phase error detector 102 at first, the respective carriers are pulled in the points on the frequency axes with the symbols "○" or "x" as shown in FIG. 12(a). In the example, it is about to become the APC pseudo lock state.

Next, the synchronization controller 11 carries out the frequency tuning process based on the output from the first frequency error detector 103 to perform such control that the respective carrier frequencies are located within a range of about ±½ of carrier frequency spacing to the proper frequency values as shown in FIG. 12(b). At that time as well, the APC process based on the output from the phase error detector 102 is continuously carried out to pull the respective carrier frequencies into the points of the symbols "○" or "x" on the frequency axes.

Lastly, the synchronization controller 11 carries out the frequency tuning process based on the output from the second frequency error detector 104 to pull the respective frequencies into the proper frequencies as shown in FIG. 12(c).

However, the APC process by the conventional synchronization controller 11 creates a problem in that even if an APC lock state is proper and a proper sound is outputted, the proper APC lock state can be shifted to the APC pseudo lock state to interrupt the sound because an APC lock release action is erroneously carried out due to, e.g., variations in input signals.

SUMMARY OF THE INVENTION

It is an object of the present invention to eliminate the problem and to provide a digital sound broadcasting receiver capable of receiving signals without sound interruption by determining whether the current APC lock state is a proper APC lock state or not, and properly performing an APC pseudo lock releasing action.

A digital sound broadcasting receiver according to the present invention includes means which detects an error rate of an error-detecting code (CRC) for error detection in data of additional information (FIC) multiplexed in a received digital sound broadcasting signal (hereinbelow, referred to as the "CRC error rate of FIC"), and which stops an APC pseudo lock releasing action of synchronization controlling means when the detected error rate is not greater than a reference value, the synchronization controlling means performing automatic phase control (APC) to a demodulated signal based on a phase of the demodulated signal of the digital sound broadcasting signal.

A digital sound broadcasting receiver according to the present invention may include means which detects an error rate of a bit error signal in sound data of a received digital sound broadcasting signal, and which stops the APC pseudo lock releasing action of the synchronization controlling means when the detected error rate is not greater than a reference value.

A digital sound broadcasting receiver according to the present invention may include means which detects an error rate of an error-detecting code (CRC) of a scale factor (ScF) in an audio frame of a received digital sound broadcasting signal (hereinbelow, referred to as the "CRC error rate of ScF"), and which stops the APC pseudo phase lock releasing action of the synchronization controlling means when the detected error rate is not greater than a reference value.

The digital sound broadcasting receiver according to the present invention may include means which detects the CRC error rate of FIC and the error rate of the bit error signal in the sound data, and which stops the APC pseudo phase lock releasing action of the synchronization controlling means when the two detected error rates are not greater than respective reference values.

The digital sound broadcasting receiver according to the present invention may include means which detects the error rate of the bit error signal in the sound data and the CRC error rate of ScF in the audio frame, and which stops the APC pseudo phase lock releasing action of the synchronization controlling means when the two detected error rates are not greater than respective reference values.

The digital sound broadcasting receiver according to the present invention may include means which detects the CRC error rate of FIC data and the CRC error rate of ScF in the audio frame, and which stops the APC pseudo phase lock releasing action of the synchronization controlling means when the two detected error rates are not greater than respective reference values.

The digital sound broadcasting receiver according to the present invention may include means which detects the CRC error rate in the FIC data, the error rate of the bit error signal in the sound data and the CRC error rate of ScF in the audio frame, and which stops the APC pseudo phase lock releasing action of the synchronization controlling means when the three detected error rates are not greater than respective reference values.

The reference value for the CRC error rate in the FIC data may be 50%.

The reference value for the error rate of the bit error signal in the audio data may be 20%.

The reference value for the CRC error rate of ScF in the audio frame may be 50%.

In addition, an automatic phase controlling method in a digital sound broadcasting receiver according to the present invention detects an error rate of received data, and stops the APC pseudo lock releasing action of the synchronization controlling means when the detected error rate is not greater than a preset reference value, the synchronization controlling means performing automatic phase control to the demodulated signal.

In the digital sound broadcasting receiver according to the present invention, the CRC error rate in the FIC data may be detected, and the APC pseudo lock releasing action of the synchronization controlling means may be stopped when the error rate is not greater than 50%. As a result, releasing proper APC lock states are minimized.

The error rate of the bit error signal in the received sound data may be detected, and the APC pseudo lock releasing action of the synchronization controlling means may be stopped when the error rate is not greater than 20%. As a result, releasing proper APC lock states are minimized.

The error rate of the error-detecting code (CRC) of the scale factor (ScF) in the audio frame may be detected, and the APC pseudo lock releasing action of the synchronization controlling means may be stopped when the error rate is not greater than 50%. As a result, releasing proper APC lock states are minimized.

The error rate of the CRC in the FIC data and the error rate of the bit error signal in the audio data may be detected, and the APC pseudo lock releasing action of the synchronization controlling means may be stopped when the error rate in the FIC data is not greater than 50% and when the error rate of the bit error signal in the audio data is not greater than 20%. As a result, releasing proper APC lock states are minimized.

The error rate of the bit error signal in the audio data and the CRC error rate of ScF in the audio frame may be detected, and the APC pseudo lock releasing action of the synchronization controlling means may be stopped when the error rate of the bit error signal in the audio data is not greater than 20% and when the CRC error rate of ScF in the audio frame is not greater than 50%. As a result, releasing proper APC lock states are minimized.

The CRC error rate in the FIC data and the CRC error rate of ScF in the audio frame may be detected, and the APC pseudo lock releasing action of the synchronization controlling means may be stopped when the error rate in the FIC data is not greater than 50% and when the CRC error rate of ScF in the audio frame is not greater than 50%. As a result, releasing proper APC lock states are minimized.

The error rate of the CRC in the FIC data, the error rate of the bit error signal in the audio data and the CRC error rate of ScF in the audio frame may be detected, and the APC pseudo lock releasing action of the synchronization controlling means may be stopped when the error rate in the FIC data is not greater than 50%, when the error rate of the bit error signal in the audio data is not greater than 20% and when the CRC error rate of ScF in the audio frame is not greater than 50%. As a result, releasing proper APC lock states are minimized.

In the automatic phase controlling method in the digital sound broadcasting receiver according to the present invention, the error rate of the received data is detected, and the phase lock releasing action of the synchronization controlling means is stopped when the detected error rate is not greater than the preset reference value. As a result, releasing proper APC lock states are minimized.

As explained, in accordance with the present invention, it is determined whether the APC lock state at the time of demodulating a signal in the digital sound broadcasting receiver is proper or not based on an error rate of one of the error-detecting code (CRC) of the fast information channel (FIC), the bit error signal in sound data and the error-detecting code (CRC) of the scale factor (ScF) in the audio frame. When the APC lock state is determined to be proper, the APC pseudo lock releasing action by the synchronization controlling means can be stopped to offer an advantage in that the digital sound broadcasting receiver can properly perform the APC pseudo lock releasing action in the synchronization controlling means.

In accordance with other modes of the present invention, it is determined whether the APC lock state at the time of demodulating a signal in the digital sound broadcasting receiver is proper or not based on error rates of two or all of the CRC error rate in the FIC data, the bit error signal in the sound data and the CRC error rate of the ScF in the audio frame. When it is determined that the APC lock state is proper, the APC pseudo lock releasing action in the synchronization controlling means can be stopped to offer an advantage in that the digital sound broadcasting receiver can perform the APC pseudo lock releasing action in the synchronization controlling means in a more proper manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Now, preferred embodiments according to the present invention will be specifically described in reference to the accompanying drawings.

Embodiment 1

Figure 1:
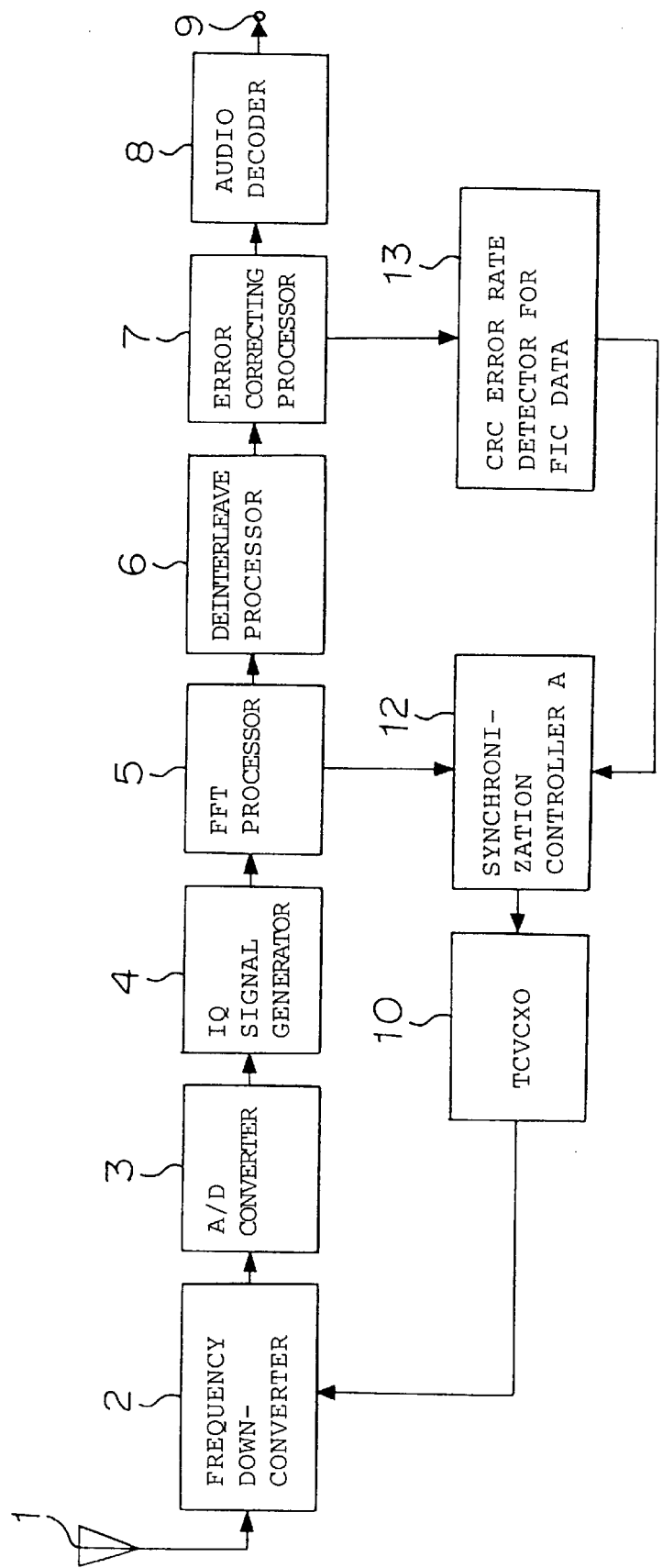
FIG. 1 is a block diagram showing the structure of the digital sound broadcasting receiver according to a first embodiment of the present invention.

In FIG. 1, there is shown a block diagram of the structure of the digital sound broadcasting receiver according to a first embodiment of the present invention. Reference numeral 1 designates an antenna. Reference numeral 2 designates a frequency down-converter. Reference numeral 3 designates an A/D converter. Reference numeral 4 designates an IQ signal generator. Reference numeral 5 designates an FFT processor. Reference numeral 6 designates a deinterleave processor. Reference numeral 7 designates an error correcting processor for performing an error correction in data by Viterbi decoding. Reference numeral 8 designates an audio decoder. Reference numeral 9 designates a digital audio output terminal. Reference numeral 10 designates a TCVCXO. Reference numeral 12 designates a synchronization controller A. Reference numeral 13 designates an error rate detector (hereinbelow, referred to as the "CRC error rate detector for FIC") which detects an error rate of a bit error-detecting code (CRC) in the data of a fast information channel (FIC) as additional information multiplexed in a received signal.

Figure 2:
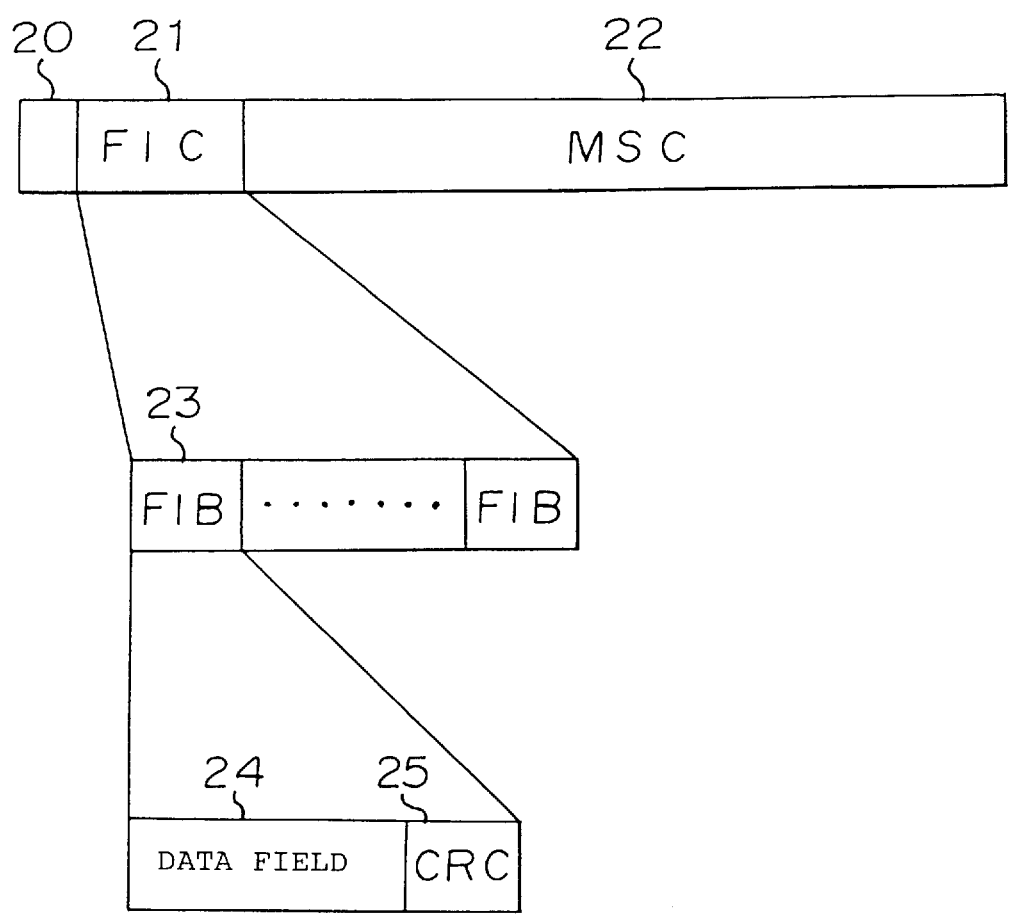
FIG. 2 is a schematic view showing the structure of a transmission frame.

In FIG. 2, there is shown a schematic view of the structure of a transmission frame which is transmitted from a digital sound broadcasting station. Reference numeral 20 designates a synchronizing signal. Reference numeral 21 designates an FIC as the additional information. Reference numeral 22 designates a main service channel (MSC). The MSC 22 includes actual sound information to be transmitted. The FIC 21 constituted by several fast information blocks (FIBs) 23, by which the additional information at present, such as a service status, a program type and a program number is transmitted. FIBs 23 are constituted by several collective fast information groups (FIGs), and are formed to be capable of transmitting additional information other than sound data though detail explanation is omitted. Reference numeral 24 designates a data field. Reference numeral 25 designates a CRC, which shows that the contents of the data field 24 in the corresponding FIB 23 are effective if checking the CRC 25 indicates OK, and which shows that the contents of the data field 24 in the corresponding FIB 23 are ineffective if checking the CRC 25 indicates NG.

Now, the operation of the first embodiment will be described referring to FIGS. 1 and 2. OFDM signals in an RF frequency band which have been inputted from the antenna 1 are down-converted into intermediate frequency signals at the frequency down-converter 2, are converted into digital signals at the A/D converter 3, and are divided into in-phase components (hereinbelow, referred to as the "I signal components") and quadrature signal components (hereinbelow, referred to as the "Q signal components") at the IQ signal generator 4. The I signal components and the Q signal components are converted into complex number data of a frequency region at the FFT processor 5, have the interleave treatment done at a transmitting end released by the deinterleave processor 6, are inputted into the audio decoder 8 as low bit rate coding data having an error corrected by the error correcting processor 7, and are decoded into a digital audio bit stream at the audio decoder 8 to be outputted from the digital audio output terminal 9.

On the other hand, the complex number data of the frequency region which are outputted from the FFT processor 5 are also inputted into the synchronization controller A 12. The synchronization controller A 12 controls the oscillation frequency of the TCVCXO 10 based on the inputted data, and the TCVCXO 10 has an outputted signal inputted into the frequency down-converter 2 to determine a center frequency of the intermediate frequency signals outputted from the frequency down-converter 2.

Figure 9:
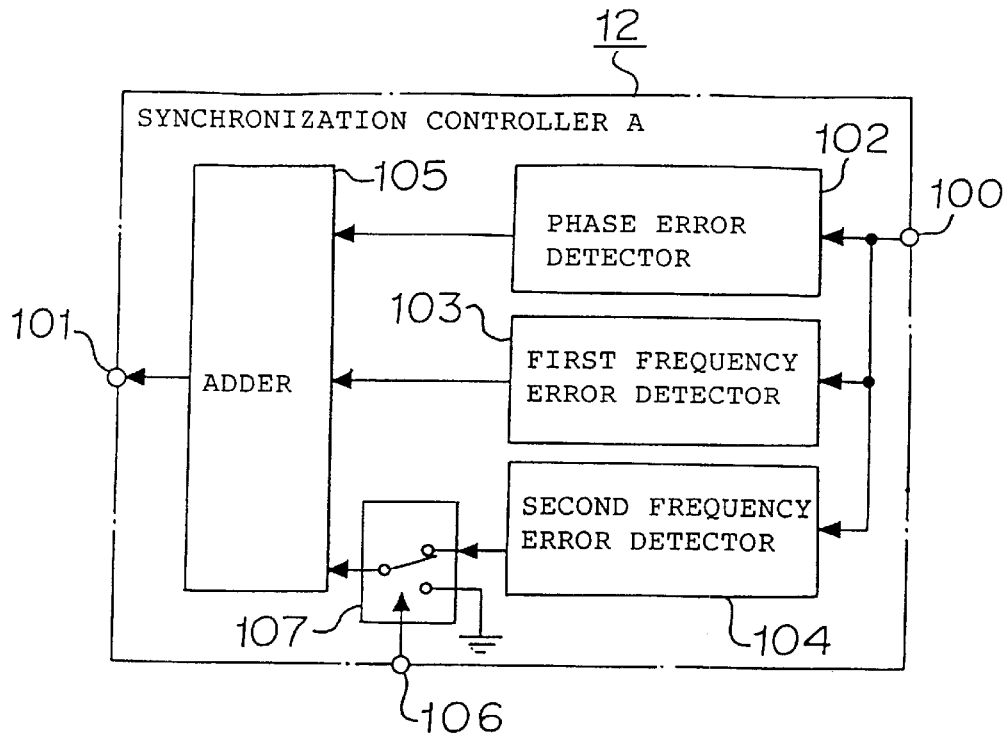
FIG. 9 is a block diagram showing the structure of a synchronization controller according to the first to third embodiments.
Figure 11:
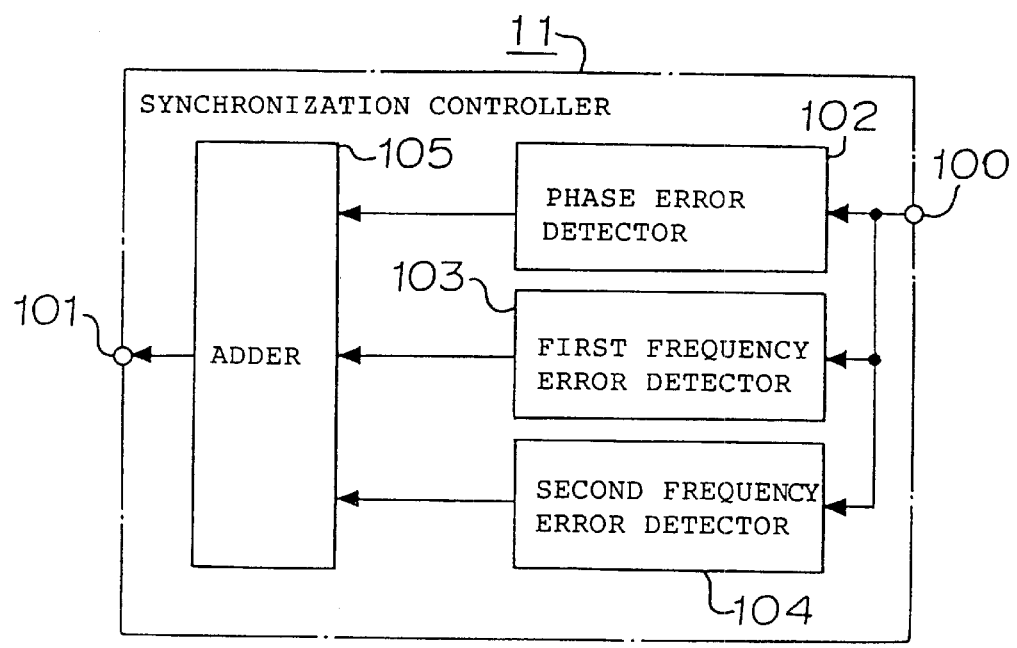
FIG. 11 is a block diagram showing the structure of the synchronization controller shown in FIG. 10.
Figure 10:
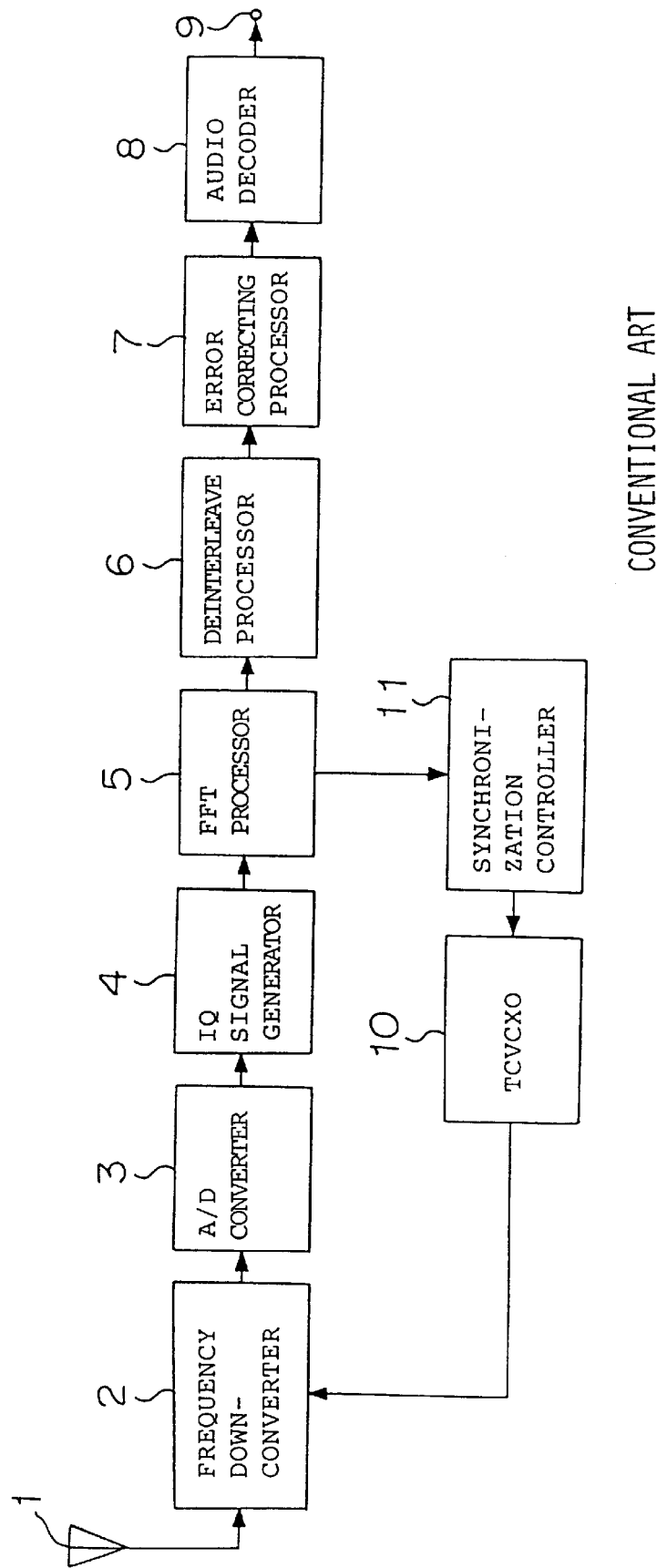
FIG. 10 is a block diagram showing the structure of a conventional digital sound broadcasting receiver.
Figure 12A:
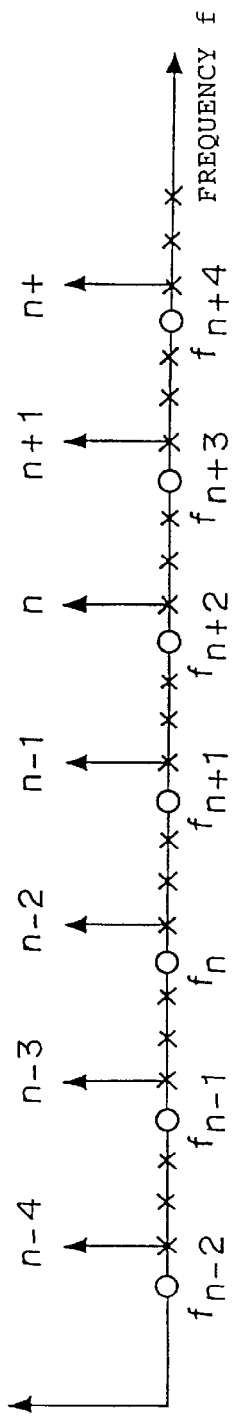
FIG. 12($a$)–($c$) are schematic views of the frequency control operation by the synchronization controller shown in FIG. 11.
Figure 12B:
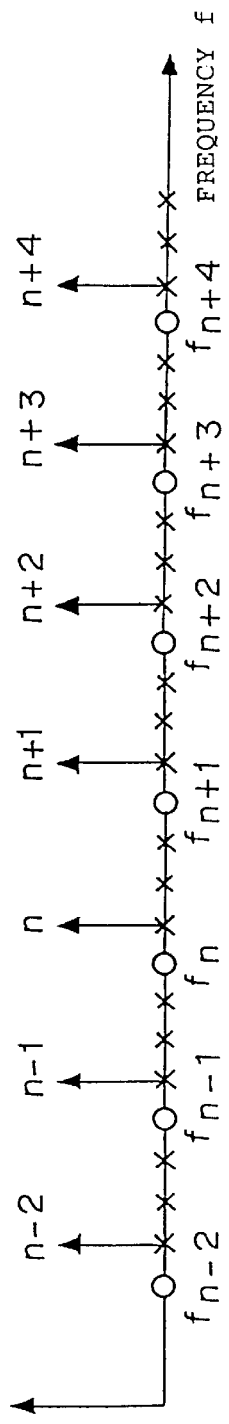
Figure 12C:
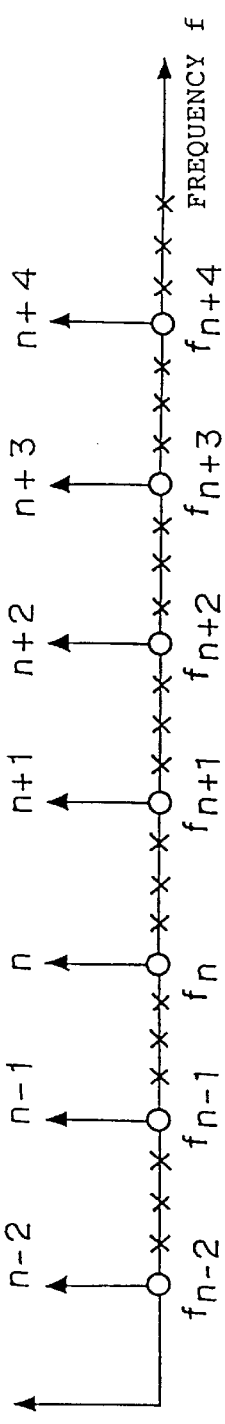

In FIG. 9, there is shown a block diagram of the structure of the synchronization controller A 12. Reference numeral 100 designates a signal input terminal. Reference numeral 101 designates a control signal output terminal. Reference numeral 102 designates a phase error detector. Reference numeral 103 designates a first frequency error detector. Reference numeral 104 designates a second frequency error detector. Reference numeral 105 designates an adder. Reference numeral 106 designates a control signal input terminal. Reference numeral 107 designates a switching unit.

In FIG. 9, the units 100–105 are the same as the ones of the conventional synchronization controller 11. The switching device 105 is controlled by an output from the CRC error rate detector 13 for the FIC data through the control signal input terminal 106, and carries out a switching operation between execution and stoppage of an APC pseudo lock state releasing process based on an output from the second frequency error detector 104.

In a proper APC lock state, the FIC 21 is taken in at the error correcting processor 7 without trouble. Information thereabout is received by a system controller not shown, and, if necessary, is indicated at an indicator not shown.

Information about the FIG 21 which is taken in is the contents of the data field 24 in the FIB 23 when the CRC 25 indicates OK. If proper output data can not be obtained due to variations in an inputted signal, the CRC 25 sometimes indicates NG.

On the other hand, in an APC pseudo lock state, decoding the data is not primarily carried out in a proper manner. Because neither the sound data nor the data in the FIC 21 in a proper state can be obtained, the CRC 25 in the data field 24 in the FIB 23 almost indicates NG.

As a result, the CRC error rate of the FIC data widely varies in a range of about 0% —about 100% even in the proper APC lock state, depending on the operational state of the receiver (e.g. electric field strength).

The CRC error rate detector 13 for the FIC data determines that the APC lock state at present is proper when the NG rate of the CRC 25 in the FIB 23 is not greater than e.g. 50%, and outputs a command to the synchronization controller A 12 to stop the APC pseudo lock releasing action. The synchronization controller A 12 which have received the command does not perform the APC lock releasing action even if the synchronization controller A determines based on the input data from the FFT processor 5 that it is in the APC pseudo lock state. The reason why the error rate of 50% is selected as the reference value for determination is that it is about half in a variable range of the CRC error rate in the proper APC lock state, and that it has been experientially found that in the state with the CRC error rate of more than 50%, reproduction of sound becomes difficult and sound output is muted, creating no problem even if the APC pseudo lock release is improperly carried out by the synchronization controller A 12. In addition, the CRC error rate for the FIC data is almost 100% in the APC pseudo lock state as stated earlier. As a result, the selection of the error rate of 50% as the determination reference does not create any problem in that the APC pseudo release action is not carried out in the APC pseudo lock state.

On the other hand, the CRC error rate detector 13 for the FIC data does not output the APC pseudo lock releasing action stopping command to the synchronization controller A 12 when the NG rate of the CRC 25 is greater than 50%. As a result, when the synchronization controller A 12 determines based on the data inputted from the FFT processor 5 that it is now in the APC pseudo lock state, the synchronization controller releases the APC lock state at present, and controls the oscillation frequency of the TCVCXO 10 based on the data newly inputted from the FFT processor 5 to shift to a new APC lock state. The CRC error rate detector 13 for the FIC data detects the error rate in the new APC lock state, and does not stop the APC pseudo lock releasing action until the error rate becomes not greater than 50%. As a result, the proper APC lock state can be established in due course to obtain proper sound output.

Embodiment 2

Figure 3:
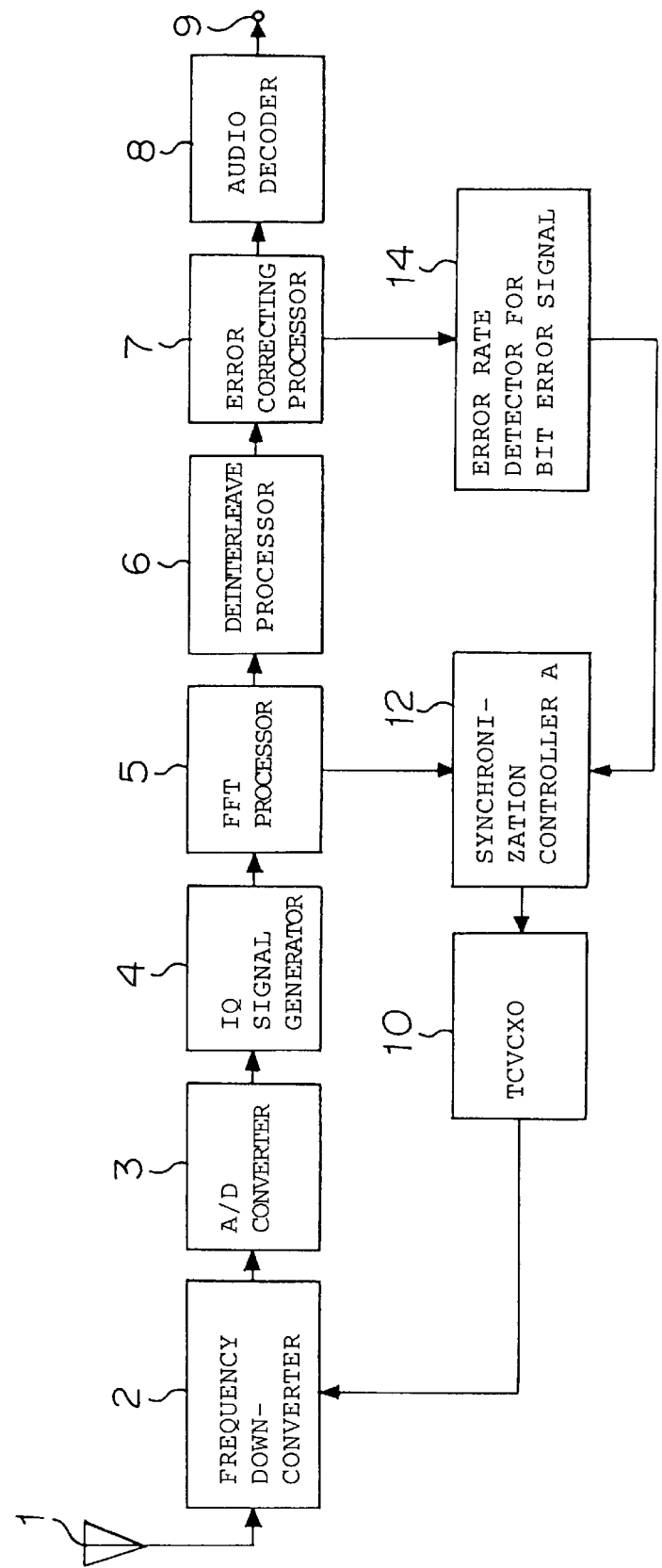
FIG. 3 is a block diagram showing the structure of the digital sound broadcasting receiver according to a second embodiment of the present invention.

In FIG. 3, there is shown a block diagram of the structure of the digital sound broadcasting receiver according to a second embodiment of the present invention. The same reference numerals as the ones shown in FIG. 1 designate portions identical or corresponding to the portions shown in FIG. 1. Reference numeral 14 designates an error rate detector for bit error signals at the error correcting processor 7 for received sound data.

With regard to FIG. 3, explanation of the portions having the same structure as those in FIG. 1 will be omitted because such portions operate in the same manner as those in FIG. 1, respectively. The operation of the error rate detector 14 for the bit error signals will be explained.

The error correcting processor 7 decodes the received sound data to perform error corrections in the data, and outputs bit error signals. The bit error rate widely varies in a range of about 0% —about 50% even in the proper APC lock state, depending on the operational state of the receiver (e.g. electric field strength).

The error rate detector 14 for the bit error signals determines that the APC lock state at present is proper when the error rate of a bit error signal is not greater than e.g. 20%, and outputs a command to the synchronization controller A 12 to stop the APC pseudo lock releasing action.

The reason why the error rate of 20% is selected as the reference value for determination is that it is about half in a variable range of the bit error rate in the proper APC lock state, and that it has been experientially found that sound output is muted because reproduced sound is difficult to be heard in the bit error rate of 10–20%, creating no problem even if the APC pseudo lock release is improperly occurred by the synchronization controller A 12.

On the other hand, the APC pseudo lock releasing action stopping command is not outputted to the synchronization controller A 12 when the bit error rate is greater than 20%. As a result, the synchronization controller A 12 can perform the APC pseudo lock releasing action based on self-determination to establish the proper APC lock state in due course, obtaining proper sound output.

Embodiment 3

Figure 4:
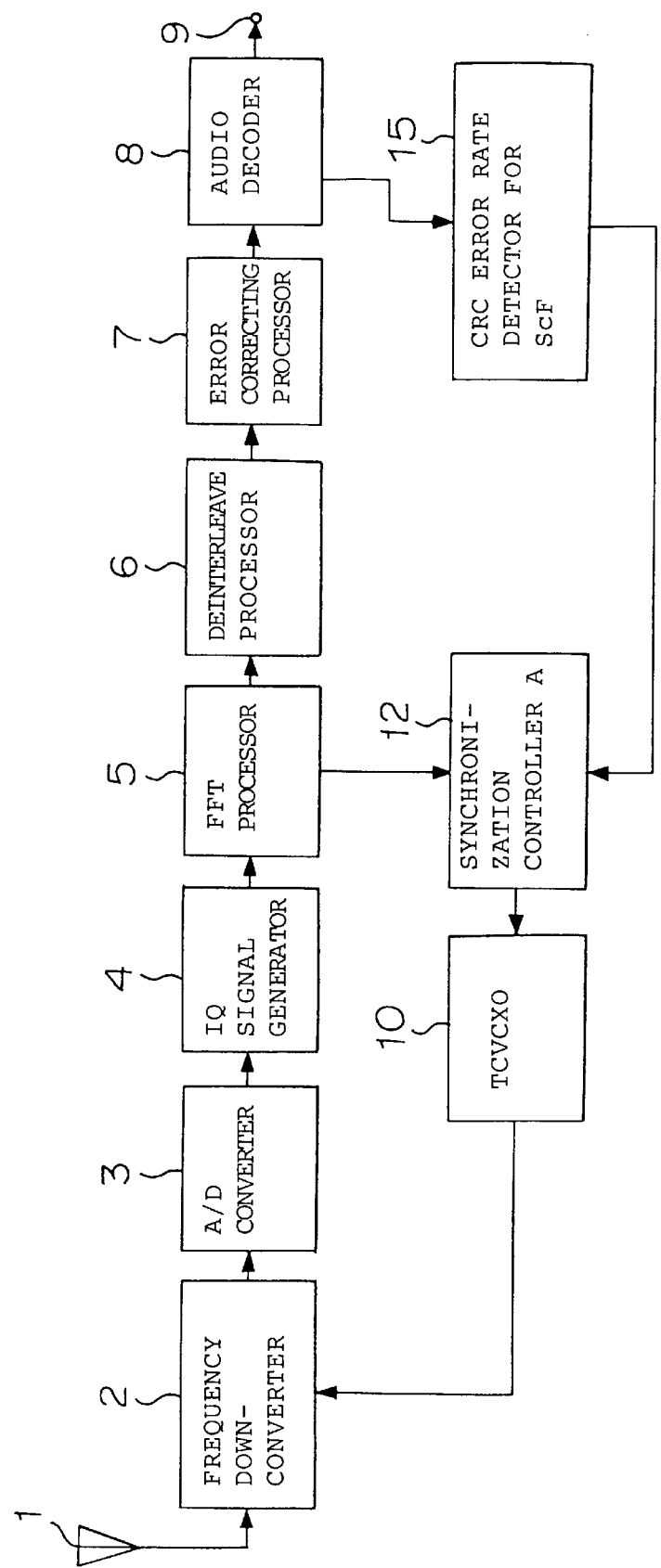
FIG. 4 is a block diagram showing the structure of the digital sound broadcasting receiver according to a third embodiment of the present invention.

In FIG. 4, there is shown a block diagram of the structure of the digital sound broadcasting receiver according to a third embodiment of the present invention. The same reference numerals as the ones shown in FIG. 1 designate portions identical or corresponding to the portions shown in FIG. 1. Reference numeral 15 designates an error rate detector (hereinbelow, referred to as the "CRC error detector for the ScF") for an error-detecting code (CRC) in a scale factor (ScF) in an audio frame.

With regard to FIG. 4, explanation of the portions having the same structure as those in FIG. 1 will be omitted because such portions operate in the same manner as those in FIG. 1, respectively. The operation of the CRC error rate detector for ScF 15 will be explained.

The CRC error rate in the ScF can be detected from the audio decoder 8. The CRC error rate in the ScF is normally as small as 0—a few % when demodulating the data is carried out in a normal manner. Conversely, it is about 100% when demodulating the data is not carried out in the proper manner, and it is tens of % on rare occasions when receiving conditions degrade.

The CRC error rate detector in ScF 15 determines that the APC lock state at present is proper when the CRC error rate in ScF is not greater than e.g. 50%, and outputs a command to the synchronization controller A 12 to stop the APC pseudo lock releasing action. The reason why the error rate of 50% is selected as the reference value for determination is that it is about half in a variable range of the CRC error rate in the proper APC lock state, and that it has been experientially found that in the state with the CRC error rate for ScF of more than 50%, reproduction of sound becomes difficult and sound output is muted, creating no problem even if the APC pseudo lock release is improperly carried out by the synchronization controller A 12. In addition, the CRC error rate for ScF is almost 100% in the APC pseudo lock state as stated earlier. AS a result, the selection of the error rate of 50% as the determination reference does not create a problem in that the APC pseudo release action is not carried out in the APC pseudo lock state.

Embodiment 4

Figure 5:
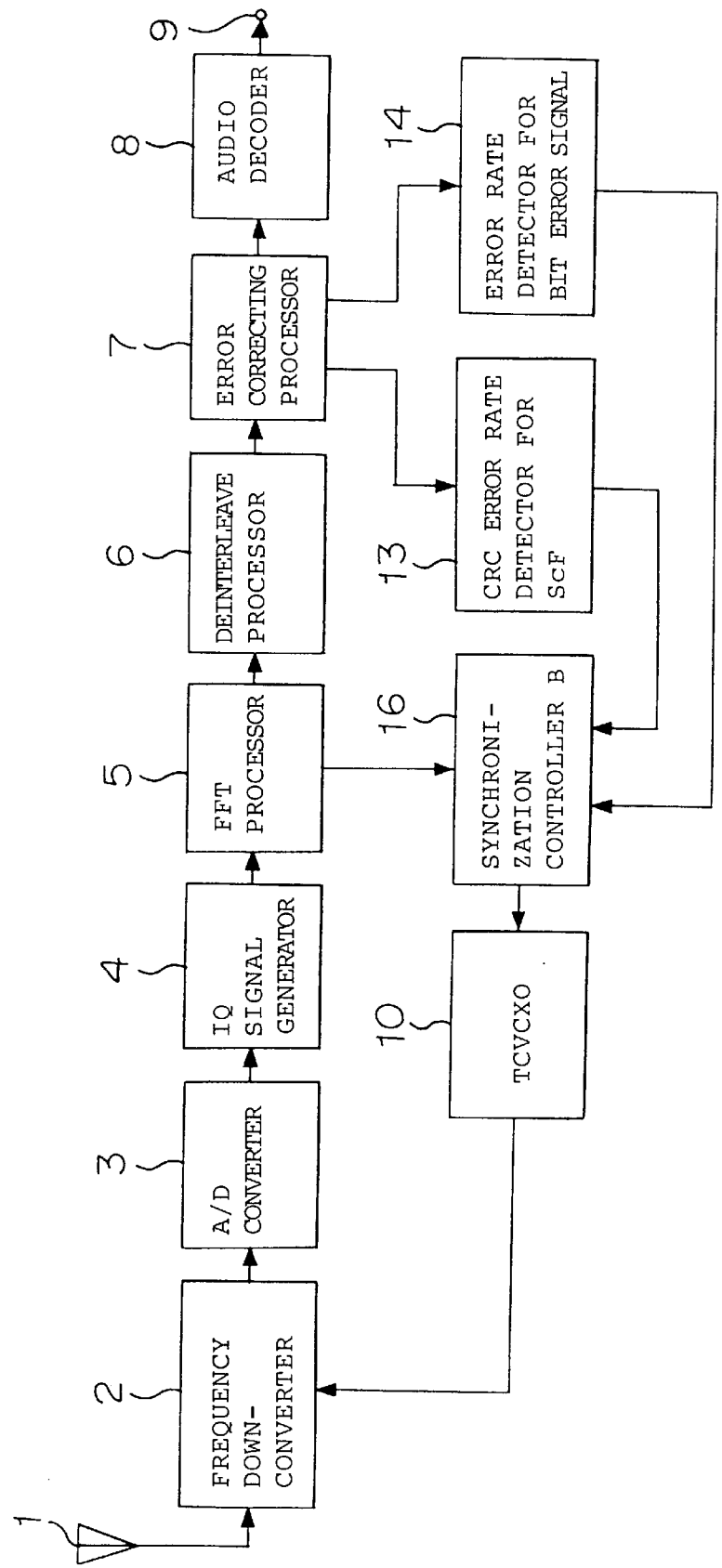
FIG. 5 is a block diagram showing the structure of the digital sound broadcasting receiver according to a fourth embodiment of the present invention.

In FIG. 5, there is shown a block diagram of the structure of the digital sound broadcasting receiver according to a fourth embodiment of the present invention. The same reference numerals as the ones shown in FIGS. 1 and 3 designate portions identical or corresponding to the portions shown in FIGS. 1 and 3. Reference numeral 16 designates a synchronization controller B.

With regard to FIG. 5, explanation of the portions having the same structure as those in FIGS. 1 and 3 will be omitted because such portions operate in the same manner as those in FIGS. 1 and 3, respectively. The operation of the synchronization controller B 16 will be explained.

The error correcting processor 7 outputs not only the NG number in the CRC 25 but also the bit error signal which is obtained when an error correction of received sound data is carried out, as explained with reference to the first embodiment and the second embodiment. The CRC error rate detector 13 for the FIC data determines that the APC lock state at present is proper when the NG rate in the CRC 25 of the FIB 23 is not greater than e.g. 50%, and outputs the APC pseudo lock releasing action stopping command to the synchronization controller B 16. On the other hand, the error rate detector 14 for the bit error signal outputs the APC pseudo lock releasing action stopping command to the synchronization controller B 16 when the error rate in the bit error signal is not greater than e.g. 20%. The synchronization controller B 16 does not release the APC pseudo lock state when the APC pseudo lock releasing action stopping command is inputted to the synchronization controller B from both of the CRC error rate detector 13 for the FIC data and the error rate detector 14 for the bit error signal.

On the other hand, the synchronization controller B 16 performs the APC pseudo lock releasing action based on self-determination when the APC pseudo lock releasing action stopping command is not inputted into the synchronization controller B from the CRC error rate detector 13 for the FIC data or the error rate detector 14 for the bit error signal. As a result, the proper APC lock state can be established in due course to obtain proper sound output.

By the way, the CRC error in the FIC data and the bit error are different in terms of timing when they are observed in the data frame (provided that the bit error is related to the data transmitted in the MSC 22). The FIC is not subjected to time interleave while the bit error is related to a signal subjected to time interleave. As a result, there is a good possibility that CRC errors in the FIC data intensively occur in terms of time in comparison with the bit errors.

When two factors of the CRC error rate in the FIC data and the bit error rate are used in order to administrate the APC lock state, the conditions and the timing that the APC pseudo lock state is regarded as occurring due to e.g.

degraded receiving conditions in spite of the presence of the proper APC lock state are supposed to be different between both factors.

Although it is considered that it is basically sufficient to administrate the bit error rates in order to detect the occurrence of the APC pseudo lock state, the bit error rates indicate errors included in the inputted data of the error correcting processor 7, and do not indicate errors left after correction.

The correction capability at the error correcting processor 7 varies on the extent of protection against error (code rate). Since the code rate of the digital sound broadcasting is variable depending on programs, there is a possibility that the errors after correction are sufficiently small and reproduction of sound is available even if the bit error rates are relatively high when the code rate is small and the protection against error is strong.

On the other hand, the CRC in the ScF indicates an error included in the sound data after correction. Since the CRC is directly related to reproduction quality of sound signals, the CRC is more appropriate to be used for determining whether the APC pseudo lock releasing action containing a possibility of the improper operation should be carried out or not.

Conversely, when the extent to protection against error is weak, the bit error rates are relatively low, and the error in CRC in the ScF becomes great even if temporary degration occurs. This means that observation of only the bit error rates increases the danger of the improper operation by an unnecessary APC pseudo lock releasing action.

Administration of the APC lock states by the two factors can decrease the danger of erroneously determining the proper APC lock state as the APC pseudo lock state.

Embodiment 5

Figure 6:
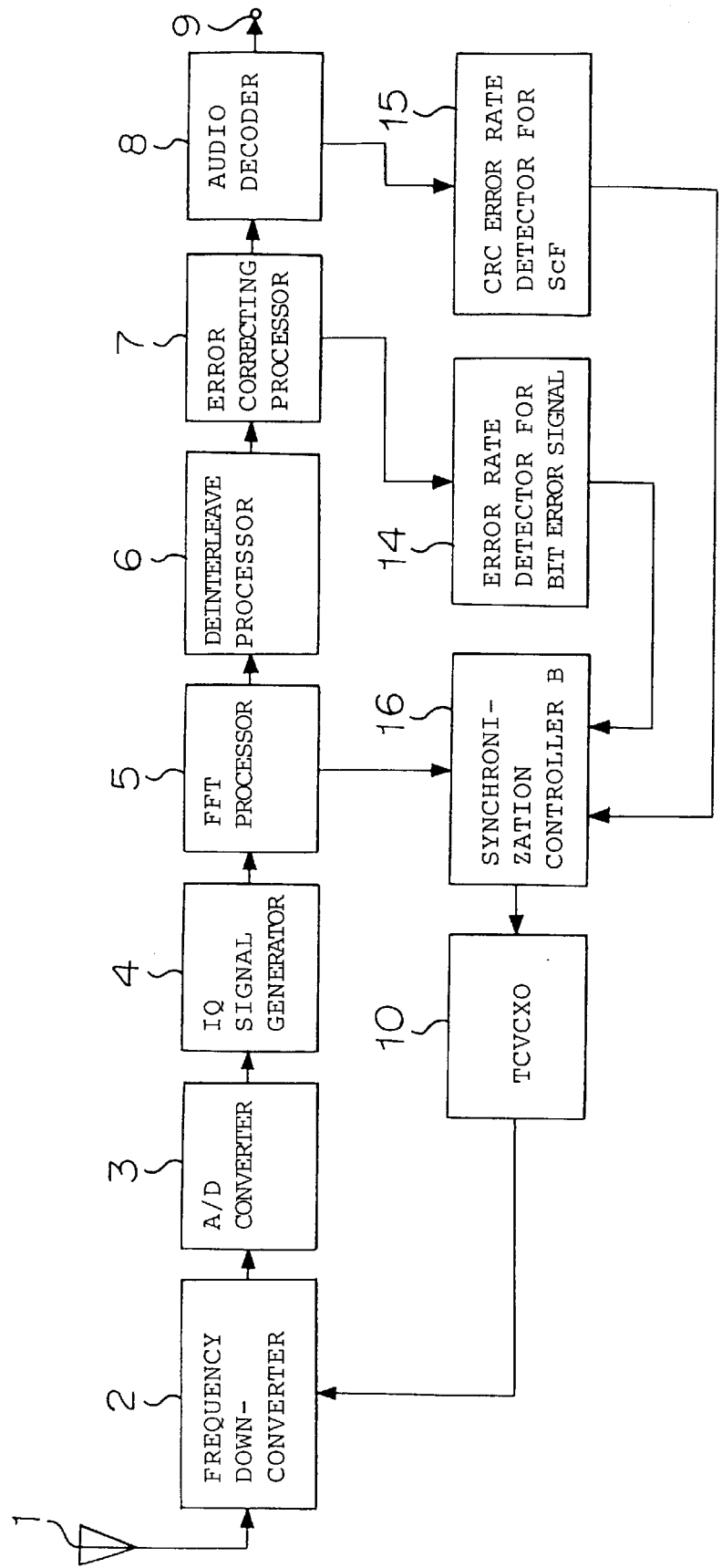
FIG. 6 is a block diagram showing the structure of the digital sound broadcasting receiver according to a fifth embodiment of the present invention.

In FIG. 6, there is shown a block diagram of the structure of the digital sound broadcasting receiver according to a fifth embodiment of the present invention. The same reference numerals as the ones shown in FIGS. 3 and 4 designate portions identical or corresponding to the portions shown in FIGS. 3 and 4. Reference numeral 14 designates the error rate detector for bit error signals. Reference numeral 15 designates the CRC error rate detector for the ScF in the audio frame. Reference numeral 16 designates the synchronization controller B.

With regard to FIG. 6, explanation of the portions having the same structure as those in FIGS. 3 and 4 will be omitted because such portions operate in the same manner as those in FIGS. 3 and 4. The operation of the synchronization controller B 16 will be explained.

The error rate detector 14 for the bit error signals determines that the APC lock state at present is proper when the error rate of the bit error signals is not greater than e.g. 20%, and outputs the APC pseudo lock releasing action stopping command to the synchronization controller B 16. The CRC error rate detector for ScF 15 determines that the APC lock state at present is proper when the CRC error rate in the ScF is not greater than e.g. 50%, and which outputs the APC pseudo lock releasing action stopping command to the synchronization controller B 16.

The synchronization controller B 16 does not release the APC pseudo lock state when the APC lock state releasing action stopping command is inputted to the the synchronization controller B from both of the error rate detector 14 for the bit error signals and the CRC error rate detector in ScF 15.

On the other hand, the synchronization controller B 16 performs the APC pseudo lock releasing action based on self-determination when the APC pseudo lock releasing action stopping command is not inputted into the synchronization controller B from the error rate detector 14 for the bit error signals or the CRC error rate detector in ScF 15. As a result, the proper APC lock state can be established in due course to obtain proper sound output.

According to the fifth embodiment, two factors of the bit error signal error rate and the CRC error rate in ScF can be used to administrate the APC lock states to decrease the danger of erroneously determining the proper APC lock state as the APC pseudo lock state.

Embodiment 6

Figure 7:
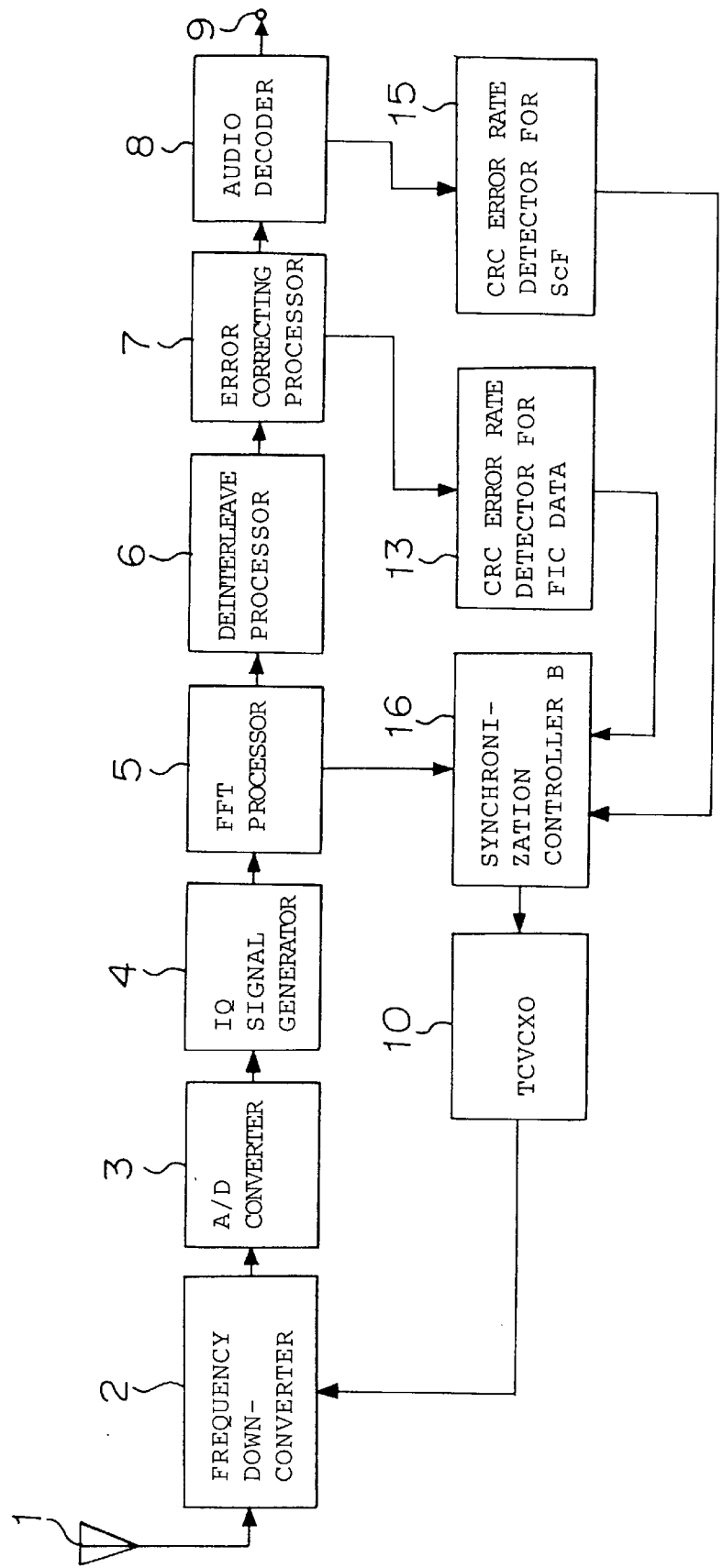
FIG. 7 is a block diagram showing the structure of the digital sound broadcasting receiver according to a sixth embodiment of the present invention.

In FIG. 7, there is shown a block diagram of the structure of the digital sound broadcasting receiver according to a sixth embodiment of the present invention. The same reference numerals as the ones shown in FIGS. 1 and 4 designate portions identical or corresponding to the portions shown in FIGS. 1 and 4. Reference numeral 13 designates the CRC error rate detector for the FIC data. Reference numeral 15 designates the CRC error rate detector for ScF. Reference numeral 16 designates the synchronization controller B.

With regard to FIG. 7, explanation of the portions having the same structure as those in FIGS. 1 and 4 will be omitted because such portions operate in the same manner as those in FIGS. 1 and 4, respectively. The operation of the synchronization controller B 16 will be explained.

The CRC error rate detector 13 for the FIC data determines that the APC lock state at present is proper when the NG rate of the CRC 25 in the FIB 23 is not greater than e.g. 50%, and outputs the APC pseudo lock releasing action stopping command to the synchronization controller B 16. The CRC error rate detector for ScF 15 determines that the APC lock state at present is proper when the CRC error rate for ScF is not greater than e.g. 50%, and outputs the APC pseudo lock releasing action stopping command to the synchronization controller B 16.

The synchronization controller B 16 stops the APC pseudo lock releasing action when the APC pseudo lock releasing action stopping command is inputted into the synchronization controller B from both of the CRC error rate detector 13 for the FIC data and the CRC error rate detector for ScF 15.

On the other hand, the synchronization controller B performs the APC pseudo lock releasing action based on self-determination when the APC pseudo lock releasing action stopping command is not inputted into the synchronization controller B from the CRC error rate detector 13 for the FIC data or the CRC error rate detector for ScF 15. As a result, the proper APC lock state can be established in due course to obtain normal sound output.

According to the sixth embodiment, administration of the APC lock state by the two factors of the CRC error rate in the FIC data and the CRC error rate in ScF can decrease the danger of erroneously determining the proper APC lock state as the APC pseudo lock state.

Embodiment 7

Figure 8:
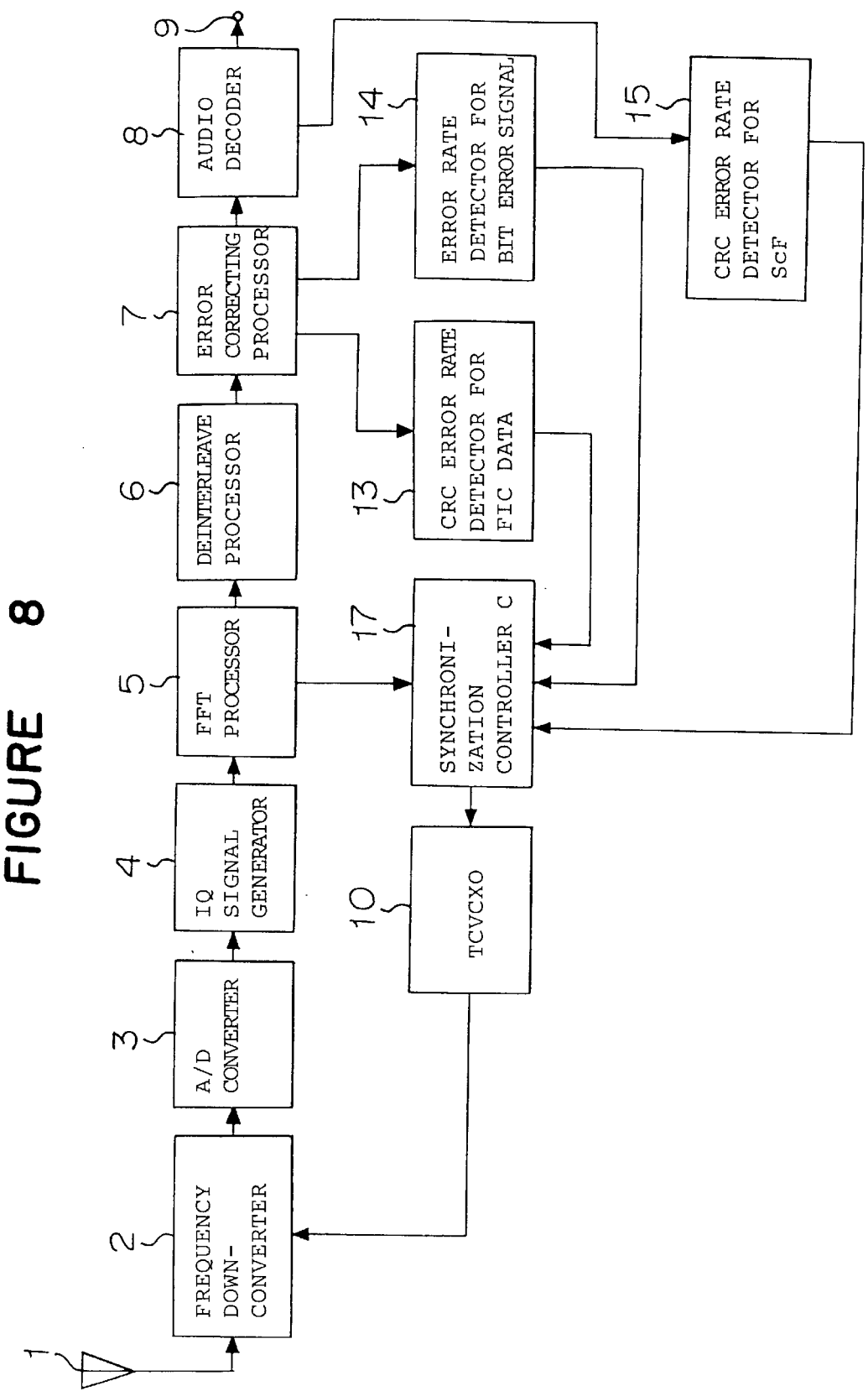
FIG. 8 is a block diagram showing the structure of the digital sound broadcasting receiver according to a seventh embodiment of the present invention.

In FIG. 8, there is shown a block diagram of the structure of the digital sound broadcasting receiver according to a seventh embodiment of the present invention. The same reference numerals as the ones shown in FIGS. 1, 3 and 4 designate portions identical or corresponding to the portions shown in FIGS. 1, 3 and 4. Reference numeral 13 designates the CRC error rate detector for the FIC data. Reference numeral 14 designates the error rate detector for bit error signals. Reference numeral 15 designates the CRC error rate detector for ScF in the audio frame. Reference numeral 17 designates a synchronization controller C.

With regard to FIG. 8, explanation of the portions having the same structure as those in FIGS. 1, 3 and 4 will be omitted because such portions operate in the same manner as those in FIGS. 1, 3 and 4. The operation of the synchronization controller C 17 will be explained.

The CRC error rate detector 13 for the FIC data determines that the APC lock state at present is proper when the NG rate of the CRC 25 in the FIB 23 is not greater than e.g. 50%, and outputs the APC pseudo lock releasing action stopping command to the synchronization controller C 17. The error rate detector 14 for bit error signals determines that the APC lock state at present is proper when the error rate of the bit error signals is not greater than e.g. 20%, and outputs the APC pseudo lock releasing action stopping command to the synchronization controller C 17. The CRC error rate detector for ScF 15 determines that the APC lock state at present is proper when the CRC error rate of ScF is not greater than e.g. 50%, and outputs the APC pseudo lock releasing action stopping command to the synchronization controller C 17.

The synchronization controller C 17 stops the APC pseudo lock releasing action when the APC pseudo lock releasing action stopping command is inputted into the synchronization controller C from three of the CRC error rate detector 13 for the FIC data, the error rate detector 14 for the bit error signals and the CRC error rate detector for ScF 15.

On the other hand, the synchronization controller C 17 performs the APC pseudo lock releasing action based on self-determination when the APC pseudo lock releasing action stopping command is not inputted to the synchronization controller C from the CRC error rate detector 13 for the FIC data, the error rate detector 14 for the bit error signals or the CRC error rate detector for ScF 15. As a result, the proper APC lock state can be established in due course to obtain normal sound output.

According to the seventh embodiment, administration of the APC lock states by the three factors of the CRC error rate for the FIC data, the bit error rate and the CRC error rate for ScF can further decrease the danger of erroneously determining the proper APC lock state as the APC pseudo lock state.

Although in the fourth embodiment the synchronization controller B 16 is set to avoid the APC pseudo lock releasing action when it receives the APC pseudo lock releasing action stopping command from both of the CRC error rate detector 13 for the FIC data and the error rate detector 14 for the bit error signals, the synchronization controller may be set to avoid the APC pseudo lock releasing action when the APC pseudo lock releasing action stopping command is received from either the detector 13 or the detector 14.

Although in the fifth embodiment the synchronization controller B 16 is set to avoid the APC pseudo lock releasing action when it receives the APC pseudo lock releasing action stopping command from both of the error rate detector 14 for the bit error signals and the CRC error rate detector for ScF 15, the synchronization controller may be set to avoid the APC pseudo lock releasing action when the APC pseudo lock releasing action stopping command is received from either the detector 14 or the detector 15.

Although in the sixth embodiment the synchronization controller B 16 is set to avoid the APC pseudo lock releasing action when it receives the APC pseudo lock releasing action stopping command from both of the CRC error rate detector 13 for the FIC data and the CRC error rate detector for ScF 15, the synchronization controller may be set to avoid the APC pseudo lock releasing action when the APC pseudo lock releasing action stopping command is received from either the detector 13 or the detector 15.

Although in the seventh embodiment the synchronization controller C 17 is set to avoid the APC pseudo lock releasing action when it receives the APC pseudo lock releasing action stopping command from three of the CRC error rate detector 13 for the FIC data, the error rate detector 14 for the bit error signals and the CRC error rate detector for ScF 15, the synchronization controller may be set to avoid the APC pseudo lock releasing action when the APC pseudo lock releasing action stopping command is received from at least one of the detector 13, the detector 14 and the detector 15.

Obviously, numerous modifications and variations of the present invention are possible in light of the above teachings. It is therefore to be understood that within the scope of the appended claims, the invention may be practiced otherwise than as specifically described herein.

What is claimed is:

1. A digital sound broadcasting receiver comprising:
   means for receiving and demodulating a signal, wherein the signal is a digital broadcast signal;
   synchronization controlling means for automatic phase controlling the demodulated signal based on a phase of the demodulated signal, for determining whether a current phase lock state is proper, and for releasing the current phase lock state and shifting to a new phase lock state when determining that the current phase lock state is improper;
   means for detecting at least two error rates of the demodulated signal; and
   means for stopping the phase lock releasing action of said synchronization controlling means when the detected error rates are not greater than respective reference values.

2. The digital sound broadcasting receiver according to claim 1,
   wherein the demodulated signal includes a fast information channel data containing data and an error-detecting code and an audio frame containing sound data, a scale factor and an error detecting code of the scale factor.

3. The digital sound broadcasting receiver according to claim 2, said error rate detecting means detecting at least two error rates selected from the error-detecting code of the fast information channel data, the bit error signal of the sound data, and the error-detecting code of the scale factor in the audio frame, and
   said phase lock release stopping means stopping the phase lock releasing action of said synchronization controlling means when the two detected error rates are not greater than respective reference values.

4. The digital sound broadcasting receiver according to claim 3,
   said error rate detecting means detecting error rates of the error-detecting code of the fast information channel data, the bit error signal in the sound data, and the error-detecting code of the scale factor in the audio frame, and
   said phase lock release stopping means stopping the phase lock releasing action of said synchronization controlling means when the three detected error rates are not greater than respective reference values.

5. The digital sound broadcasting receiver according to claim 3, wherein the reference value error rate of the fast information channel data is 50%.

6. The digital sound broadcasting receiver according to claim 3, wherein the reference value error rate of the bit error signal of sound data in the demodulated signal is 20%.

7. The digital sound broadcasting receiver according to claim 3, wherein the reference value error rate of the scale factor in the audio frame of the demodulated signal is 50%.

8. An automatic phase controlling method in a digital sound broadcasting receiver which includes synchronization controlling means for automatic phase controlling a received, demodulated signal based on a phase of the received, demodulated signal for determining whether a current phase lock state is proper, and for releasing the current phase lock state and shifting to a new phase lock state when determining that the current phase lock state is improper, comprising the steps of:

detecting at least two error rates of the received, demodulated signal; and stopping phase lock releasing action of the synchronization controlling means when the detected error rates are not greater than respective, preset reference values.

9. The automatic phase controlling method according to claim 8, wherein the signal includes a fast information channel data containing data and an error-detecting code and an audio frame containing sound data, a scale factor and an error-detecting code of the scale factor.

10. The automatic phase controlling method according to claim 9, said error rate detecting step detecting at least two error rates selected from the error-detecting code of the fast information channel data, the bit error signal of the sound data, and the error-detecting code of the scale factor in the audio frame, and said phase lock release stopping step stopping the phase lock releasing action of the synchronization controlling means when the three detected error rates are not greater than respective reference values.

11. The automatic phase controlling method according to claim 10, wherein the reference value error rate of the fast information channel is 50%.

12. The automatic phase controlling method according to claim 10, wherein the reference value error rate of the bit error signal of sound data in the signal is 20%.

13. The automatic phase controlling method according to claim 10, wherein the reference value error rate of the scale factor in the audio frame of the signal is 50%.

14. The automatic phase controlling method according to claim 9, said error rate detecting step detecting error rates of the error-detecting code of the fast information channel data, the bit error signal in the sound data, and the error-detecting code of the scale factor in the audio frame, and said phase lock release stopping step stopping the phase lock releasing action of the synchronization controlling means when the three detected error rates are not greater than respective reference values.

* * * * *